United States Patent [19]
Komatsu et al.

[11] Patent Number: 5,358,896
[45] Date of Patent: Oct. 25, 1994

[54] METHOD OF PRODUCING OPTICAL INTEGRATED CIRCUIT

[75] Inventors: Keiro Komatsu; Tatsuya Sasaki; Tomoaki Kato; Ikuo Mito, all of Tokyo, Japan

[73] Assignee: NEC Corporation, Tokyo, Japan

[21] Appl. No.: 841,025

[22] Filed: Feb. 25, 1992

[30] Foreign Application Priority Data

Feb. 25, 1991 [JP] Japan .................. 3-028994

[51] Int. Cl.$^5$ .................. H01S 3/19; H04B 10/12; G02B 6/12
[52] U.S. Cl. .................. 437/89; 437/90; 437/91; 437/129; 437/133; 372/45; 372/46; 372/50; 385/14; 385/131
[58] Field of Search .................. 437/89, 90, 91, 129, 437/133; 372/45, 46, 50; 385/131, 14

[56] References Cited

U.S. PATENT DOCUMENTS

| | | | |
|---|---|---|---|
| 4,066,482 | 1/1978 | Shaw . | |
| 4,084,130 | 4/1978 | Holton | 372/45 |
| 4,114,257 | 9/1978 | Bellavance | 437/129 |
| 4,116,530 | 9/1978 | Bellavance et al. | 385/131 |
| 4,811,351 | 3/1989 | Matsui et al. | 372/45 |
| 4,831,628 | 5/1989 | Tsang | 156/610 |
| 5,058,121 | 10/1991 | Paoli | 372/45 |
| 5,179,566 | 1/1993 | Iwano et al. | 372/45 |

OTHER PUBLICATIONS

"Integrated Optical Bent Waveguide with grown 45° Mirror by Selective Liquid-Phase Epitaxy of GaAs", *Journal of Applied Physics*, vol. 61, No. 12, Jun. 15, 1987, By S. Kim et al., pp. 5478-5480.

"Double-Heterostructure GaAs/AlGaAs Lasers on Si Substrates with Reduced Threshold Current and Built--In Index Guiding by Selective-Area Molecular Beam Epitaxy", *Applied Physics Letters*, vol. 56, No. 11, Mar. 12, 1990, By H. Lee et al., pp. 1014-1016.

*Primary Examiner*—Mary Wilczewski
*Attorney, Agent, or Firm*—Young & Thompson

[57] ABSTRACT

There is to provide a method of producing efficiently a custom IC optical integrated circuit with convenient connections between tile optical devices with less loss of the light and with different connection but similar configuration. The optical integrated circuit is comprised of a plurality of ridge-type active optical devices formed of a variable wavelength laser section and a light modulator and a ridge-type passive optical waveguide of a Y-branching optical waveguide for connecting between the ridge-type active optical devices with each other or for connecting the plural ridge-type active optical devices with output waveguides, and ridge sections of the ridge-type active optical device and the ridge-type passive optical waveguide are formed by the selective crystal growth.

3 Claims, 12 Drawing Sheets

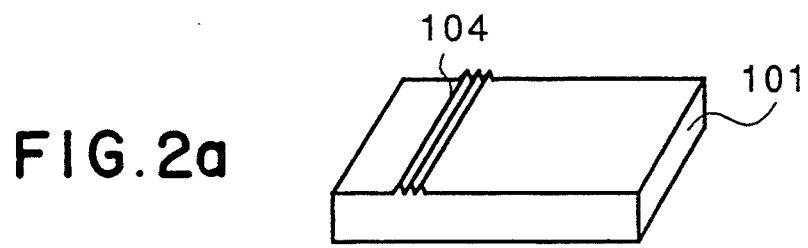
FIG.2a
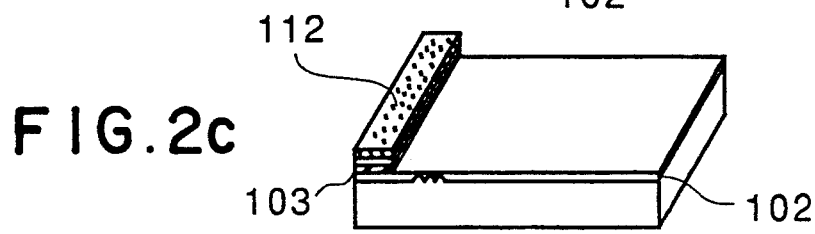
FIG.2b
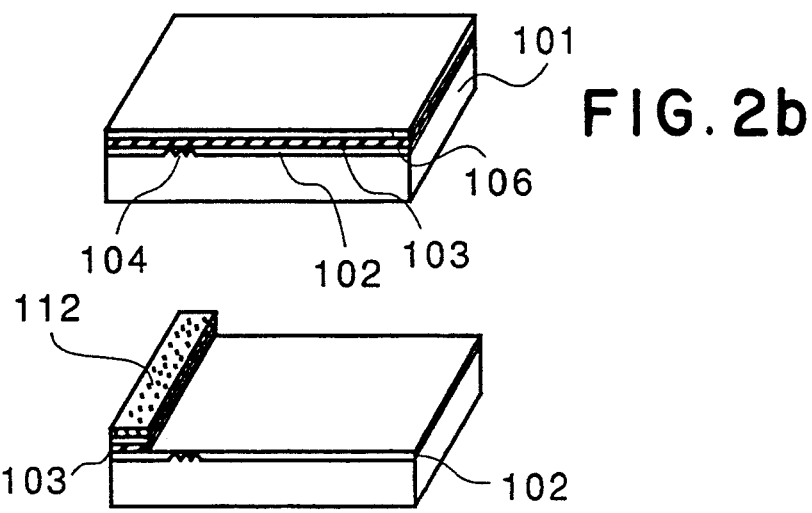
FIG.2c
FIG.2d
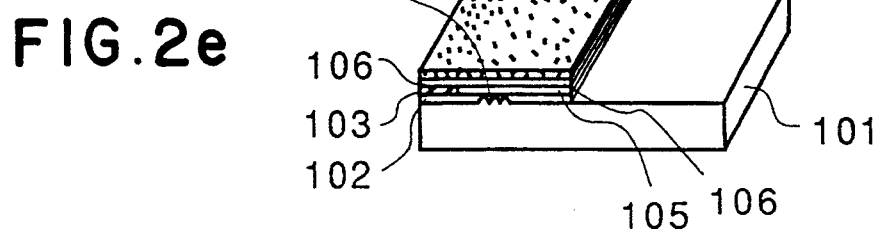
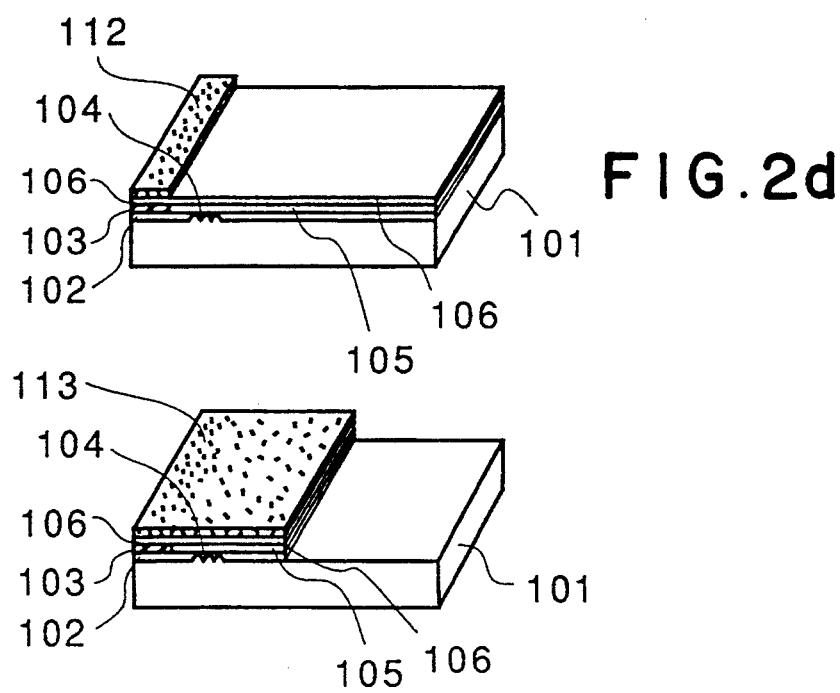
FIG.2e

METHOD OF PRODUCING OPTICAL INTEGRATED CIRCUIT

BACKGROUND OF THE INVENTION

The present invention relates to a method of producing an optical integrated circuit in which a plurality of waveguide-type optical devices are integrated on a substrate, and more particularly to a method of producing an optical integrated circuit capable of optical wiring between the waveguide-type optical devices even after formation of the waveguide-type optical devices with different connection but a similar configuration.

In recent years, to cope with advent of our highly computerized society, the research, development, and practical use of optical fiber communication for transmitting information with a larger capacity have rapidly been promoted. Conventionally, the use of optical communication was essentially for communicating from one point to another pint, communication on a so-called point-to-point basis. Accordingly, only a single photodiode or a transmitter has satisfactorily been used as an optical device.

However, the following items will be significant problems in the near future, namely (1) in photonic switching techniques, light signals are processed without conversion into electrical signals, (2) in wavelength division multiplexing transmission, a plurality of rays emitted from a plurality of semiconductor laser sources are transmitted together through a single optical fiber, and (3) in coherent light transmission techniques, complicated processing of signals is required at the receiver end. In such a system necessitating complicated processing, combining each optical device with hybrid junctions with each other may not be considered as a satisfactory method from a cost and reliability standpoint. Thus, research and development have just started for a so-called optical integrated circuit in which the required optical devices are monolithically integrated on a substrate and in particular for an optical integrated circuit in which a plurality of different optical devices are integrated on the same substrate. A method of optical wiring for connecting between a plurality of optical devices has not yet been proposed.

SUMMARY OF THE INVENTION

An object of the invention is to provide a method of producing an optical integrated circuit which is integrated with a plurality of different waveguide-type optical devices with easier connection between the optical devices and low loss and capable of effectively producing a custom IC optical integrated circuit, which is generally used in the Si LSI field providing different connections but the same configuration.

To achieve the object of the invention, there is provided a method of producing an optical integrated circuit having on a semiconductor substrate a plurality of ridge-type active optical devices and a ridge-type passive optical waveguide to connect the ridge-type active optical devices with one another and to connect the plural ridge-type active optical devices with output waveguides, wherein the ridge sections of the ridge-type active optical device and the ridge-type passive optical waveguide are formed by means of selective crystal growth.

Further, the method of producing an optical integrated circuit in accordance with the present invention has processes of forming a ridge-type active optical device on a semiconductor substrate, burying the portion other than the ridge-type active optical device by a semiconductor layer including at least an optical guiding layer and a cladding layer, forming a dielectric mask pattern to be used for the selective growth on the semiconductor layer including the optical guiding layer and the cladding layer, and selectively growing a semiconductor cladding layer only on a window of the mask pattern to form a ridge-type passive optical waveguide to connect the ridge-type active optical devices with one another or to connect the ridge-type active optical devices with output waveguides.

Still further, the method of producing the optical integrated circuit according to the invention has processes of forming the portion other than ridge sections of a plurality of ridge-type active optical devices on a semiconductor substrate, burying the portion other than the ridge-type active optical device by a semiconductor layer including at least an optical guiding layer and a cladding layer, forming a dielectric mask pattern to be used for the selective growth on the ridge-type active optical device and the semiconductor layer and the cladding layer and selectively growing a semiconductor cladding layer only on windows of the mask pattern to form together a ridge section of the ridge-type active optical device and an opposite ridge section of a ridge-type passive optical waveguide to connect the ridge-type active optical devices with each other or to connect the plural ridge-type active optical devices with output waveguides.

In a method of producing an optical integrated circuit in accordance with the present invention, a ridge-type active optical device is formed before a passive optical waveguide for optical wiring is formed by the growth of a ridge section with a selective growth technique. Such a ridge-type optical waveguide formed by the selective growth technique enables easier fine machining with far superior accuracy of dimension as compared with that of processing the optical waveguide by the wet chemical etching. The selectively grown ridge-type optical waveguide which is free of damage provides a high evenness of the side wall of the ridge section with less loss as compared with the processing of the light waveguide by dry etching.

Further, according to the present invention, after a ridge-type active optical device is provided, a passive optical waveguide for optical wiring is formed by selective growth. Thus, a mask for the active optical devices may be commonly utilized even for producing the custom IC optical integrated circuit with different connection but similar configuration. Therefore, by modifying the optical wiring mask depending solely on its application, the custom IC optical integrated circuit may be produced with higher efficiency.

BRIEF DESCRIPTION OF THE DRAWINGS

FIGS. 2a–2e are views of successive steps in the production of the integrated light source for wavelength multiplexing of FIG. 1;

PREFERRED EMBODIMENTS OF THE INVENTION

Figure 1:
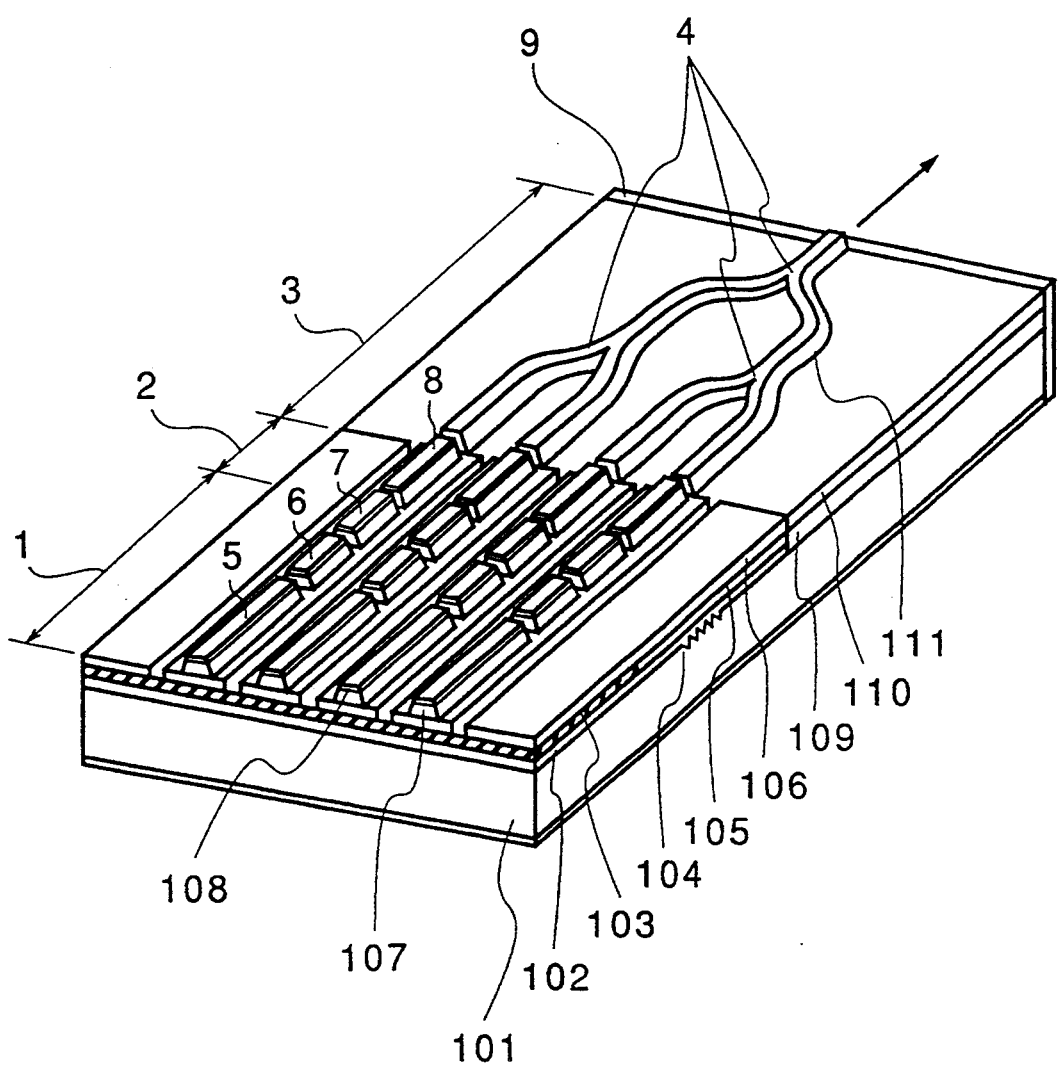
FIG. 1 is a perspective view of a first embodiment of a method of producing an optical integrated circuit according to the present invention, showing a configuration of an integrated light source for wavelength multiplexing.

In an integrated light source for wavelength multiplexing of FIG. 1, an InP substrate is integrated thereon with a variable wavelength distributed Bragg reflector (DBR) type laser section 1 formed of four ridge-type variable wavelength type DBR lasers, a light modulator unit 2 formed of four ridge-type Franz-Keldysh-type light modulators, and a ridge-type optical coupler unit 3 of four inputs and one output. The four DBR lasers are then allowed to oscillate as a continuous wave (cw) of respectively different optical wavelengths. Each resultant cw-oscillated light may be modulated with a smaller spectrum chirping at a high speed by the light modulators on a tip of each DBR laser. The respective modulated light is wavelength-multiplexed by the optical coupler unit 3 of the four inputs and one output and is emitted from devices.

FIG. 1 shows an example for a wavelength multipied light source emitted by multiplexing four wavelengths. Notwithstanding, the number of multiplexing may conveniently be increased. Accordingly, since the integrated wavelength multipied light source as shown in the present embodiment provides a high speed modulation with a smaller spectrum chirping, then it may be utilized as an optical communication light source of a very large capacity with a high density of wavelength multiplexing.

In FIG. 1, the variable wavelength distributed Bragg reflector (DBR) laser section 1 is comprised of an active region 5 which employs an InGaAs/InGaAsP Multiple Quantum Well (MQW) as an active layer, a phase control region 6, and a DBR region 7 with a diffraction grating 104.

In FIGS. 2a–2e and 3a–3d, the diffraction grating 104 is formed only at the portion of the DBR region on an n+-InP substrate 101 (see FIG. 2a). Thereafter, by a metal organic vapor phase epitaxy (MOVPE) method, an entire substrate is continuously grown thereon with an n-InGaAsP guiding layer 102 (wavelength composition is 1.3 micro meters, thickness of the layer is 1,000 angstroms), an InGaAs/InGaAsP MQW active layer 103 and a p-InP cladding layer 106 (layer thickness is about 1,000 angstroms) (see FIG. 2b). A well layer of the MQW active layer 103 has thickness of about 70 angstroms, and a barrier layer has wavelength composition of 1.3 micro meters and thickness of about 150 angstroms. Then, with use of the mask of $SiO_2$ film 112, the portion other than the active region 5 of the DBR laser is selectively removed by the etching up to the InGaAs/InGaAsP MQW active layer 103 (see FIG. 2c). The removed portion thus obtained is epitaxially grown thereon with, similarly employing the mask of $SiO_2$ film 112, an i-InGaAsP light absorption layer 105 (wavelength composition is 1.04 micro meters, layer thickness is 2,000 angstroms), and a p-InP cladding layer 106 (layer thickness is 5,000 angstroms) (see FIG. 2d). After removing the $SiO_2$ film 112, with use of the mask of a $SiO_2$ film 113, the portion other than the DBR laser section 1 is selectively removed by the etching until the n+-InP substrate is exposed (see FIG. 2e).

Figure 3A:
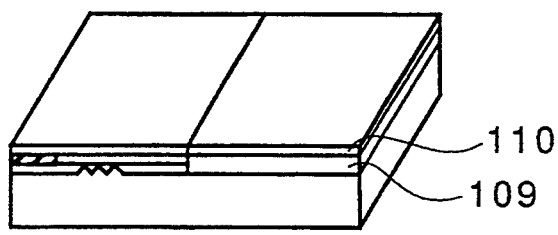
FIGS. 3a–3d are views similar and subsequent to those of FIGS. 2a–2e.
Figure 3B:
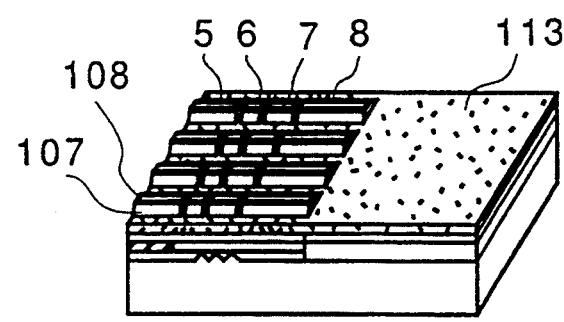

With use of the $SiO_2$ film 113 as a mask, an i-InGaAsP guiding layer 109 (wavelength composition is 1.15 micro meters, layer thickness is 3,000 angstroms) and an i-InP cladding layer 110 (layer thickness is 5,000 angstroms) are allowed to be epitaxially grown, and the $SiO_2$ film 113 is removed (see FIG. 3a. By using the $SiO_2$ film 113 as a mask having windows only at the portion corresponding to four regions, namely the active region 5 of the variable wavelength DBR laser section 1, the phase control region 6, the DBR region 7 and the modulator region 8, a p-InP cladding layer 107 and a P+-InGaAs capping layer 108 are selectively grown only at such windows to form a ridge section of a ridge-type variable wavelength DBR laser (see FIG. 3b). The mask windows of the $SiO_2$ film 113 has width of about 3.5 micro meters, and for respective length of the windows, the active region 5 has 600 micro meters, the phase control region 6 has about 100 micro meters, and the DBR region 7 has about 150 micro meters. The p-InP cladding layer 107 and the p+-InGaAs capping layer 108 have thicknesses respectively of about 5,000 angstroms and about 2,000 angstroms.

Figure 3C:
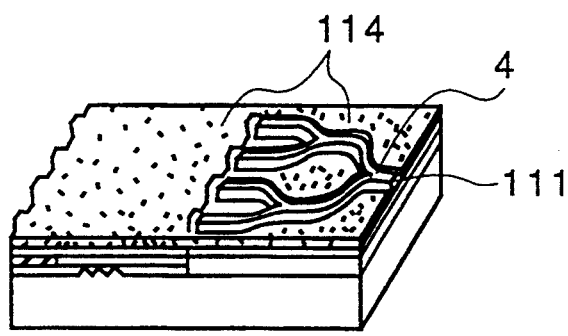
Figure 3D:
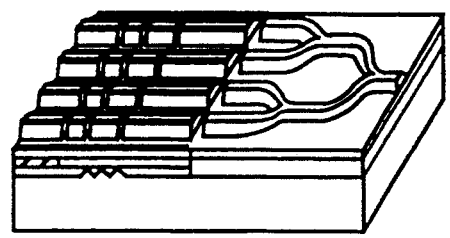

The $SiO_2$ film 113 is removed to form a mask of an $SiO_2$ film 114 having a window only at the portion corresponding to a Y-branching optical waveguide 4, and then by the selective growth of an i-InP cladding layer 111 only on the windows, the ridge section of the optical coupler unit 3 is formed (see FIG. 3c). The i-InP cladding layer 111 has thickness of about 7,000 angstroms and the mask of the $SiO_2$ film 114 has width of about 3.5 micro meters. Finally, the $SiO_2$ film 114 to be used for selective growth is removed to form a low reflection film at the end surface of the optical coupler unit 3, ending to produce the device (FIG. 3d).

The method of producing the integrated light source for wavelength multiplexing has been described. The optical integrated circuits produced by the method in accordance with the invention are capable of connecting the respective variable wavelength DBR laser output light to the output waveguide with less loss, and also the custom IC optical integrated circuits with different connection but similar configuration may effectively be produced as hereinafter described more in detail.

The integrated variable wavelength light source of FIG. 1 is produced by the selective growth of the ridge-type optical waveguide as mentioned using FIGS. 2c–2e and 3c–3d. The method of producing the ridge-type optical waveguide by the selective growth is described in detail as follows.

Figure 4A:
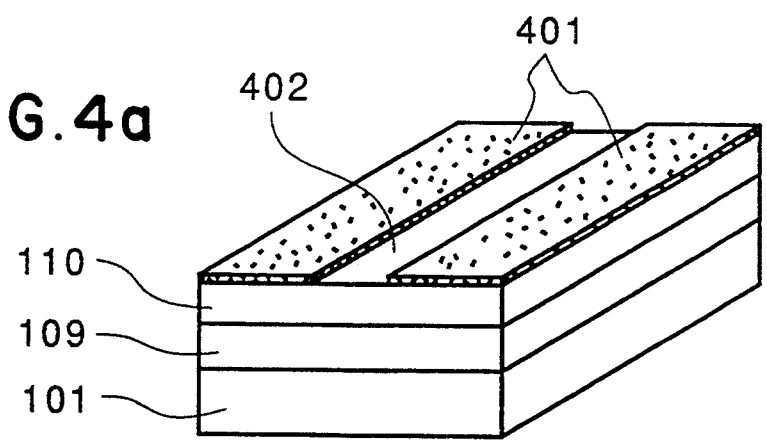
FIGS. 4a–4c show successive steps in a method of forming a ridge-type optical waveguide by selective growth with the integrated light source for wavelength multiplexing of FIG. 1.
Figure 4B:
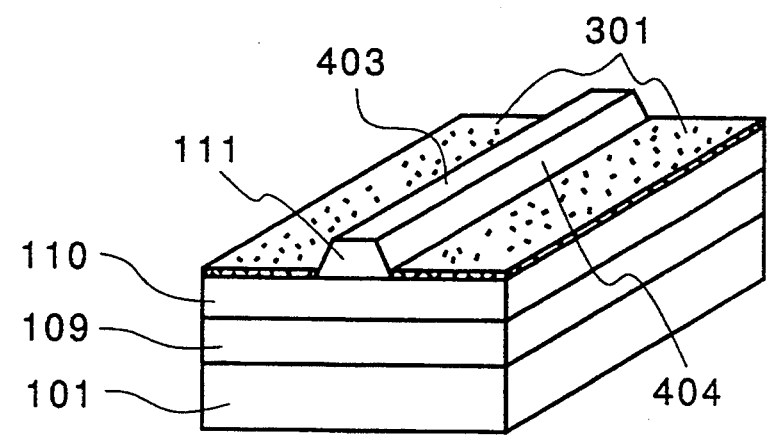
Figure 4C:
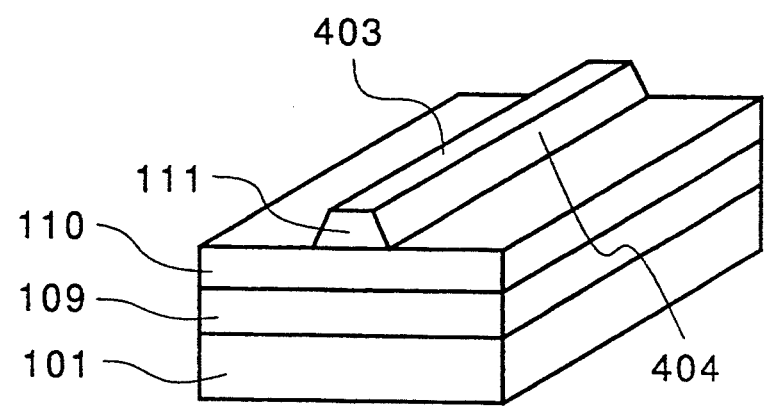

In FIGS. 4a–4c, a wafer of the n+-InP substrate 101 is sequentially stacked with the i-InGaAsP guiding layer 109, and the i-InP cladding layer 110 is formed thereon with a mask of an $SiO_2$ film 401 having a window 402 only at the portion to be formed with the ridge (see FIG. 4a). Thereafter, with use of the MOVPE method and the like the i-InP clad layer 111 is selectively grown only at the window 402 of the mask of the $SiO_2$ film 401, a ridge section 403 is thus formed (see FIG. 4b). Then the $SiO_2$ film 401 is removed to form a ridge-type optical waveguide produced by selective growth (see FIG. 4c).

A side-wall 404 of the ridge-type optical waveguide formed by selective growth produces a certain smooth crystal face (for example, in the growth on (100) face with the MOVPE method, the side-wall of the ridge is (111) face) absolutely without scattering loss to be caused by roughness of the side-wall of the ridge.

In the method of forming the ridge-type optical waveguide by selective growth according to the present invention, since no damage occurs by etching, the waveguide loss is further reduced as compared with the method of forming the ridge-type optical waveguide by dry etching.

According to experimentation conducted by the inventors of the present invention, waveguide loss of the optical waveguide formed by the method of the invention is as low as 0.2 dB/cm.

However, the integrated light source for wavelength multiplexing in FIG. 1 constitutes an optical coupler unit 3 by the optical waveguide with a much lower loss as hereinbefore described. Thus, an output light of the variable wavelength DBR laser may be introduced to an output waveguide of the devices almost without any loss with except a loss at the light modulator 2, a coupling loss between the optical modulator 2 and the Y-branching optical waveguide 4 and a combining loss at the Y-branching optical waveguide 4. The invention may thus provide an integrated light source for waveguide multiplexing with a higher output than conventional light sources.

Figure 5:
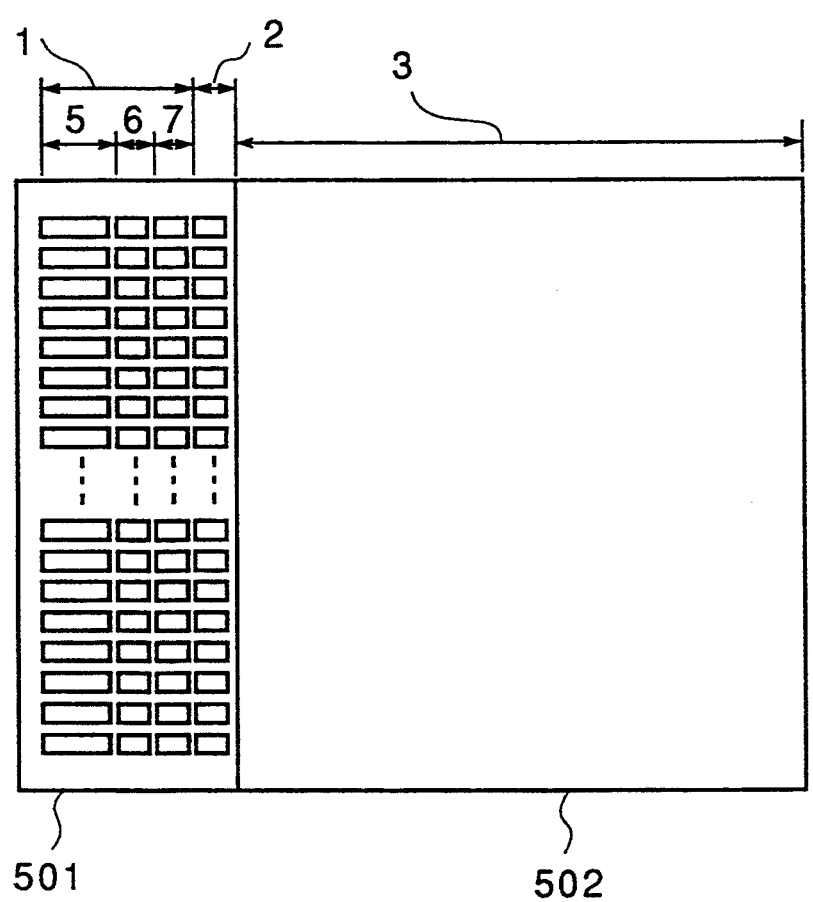
FIG. 5 is a top view of a wafer showing a state before a ridge-type optical waveguide is formed by selective growth with respect to an optical coupler unit of the integrated light source for wavelength multiplexing of FIG. 1.

The invention also provides a method of efficiently producing a custom IC optical integrated circuit with a different connection but similar configuration. FIG. 5 shows the upper surface of the wafer in the state before the ridge-type optical waveguide of the optical coupler unit 3 is formed by selective growth or in the state after the $SiO_2$ film has been removed in the process of FIG. 3b). Thus, the optical coupler unit 3 is formed thereon with a mask of the $SiO_2$ film having the windows only at the portion on which the Y-branching optical waveguide is to be formed, and the ridge-type optical waveguide of the optical coupler unit is formed by selective growth to produce a desired integrated light source for wavelength multiplexing.

Figure 6:
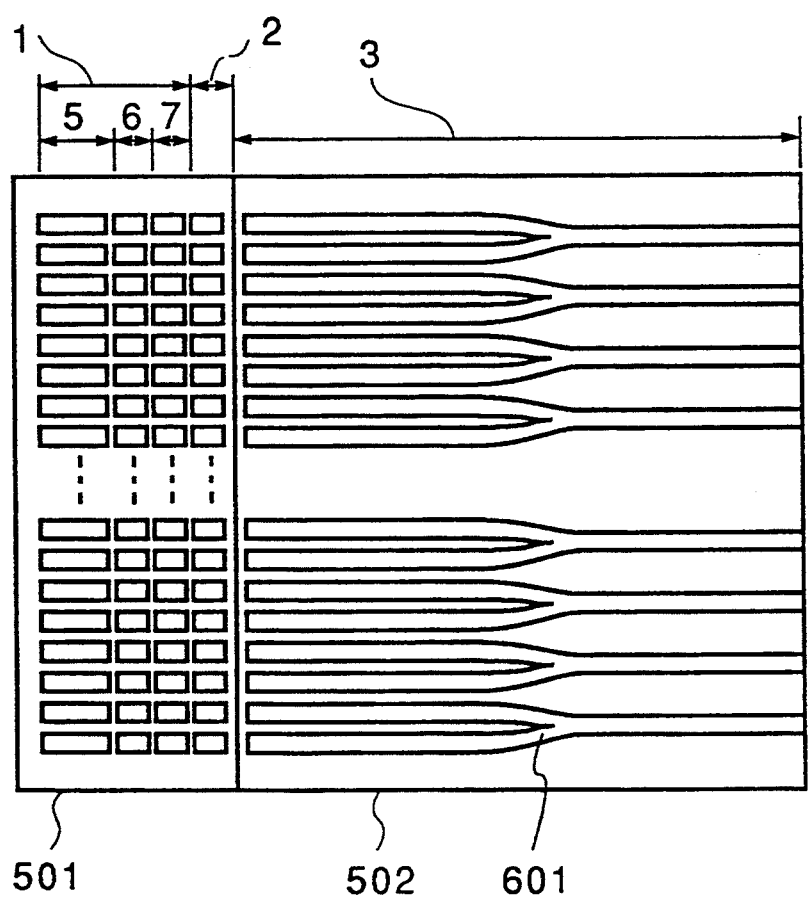
FIG. 6 is a top view of a wafer of an embodiment showing a ridge-type optical waveguide formed by selective growth with respect to an optical coupler unit of the integrated light source for wavelength multiplexing of FIG. 1.
Figure 7:
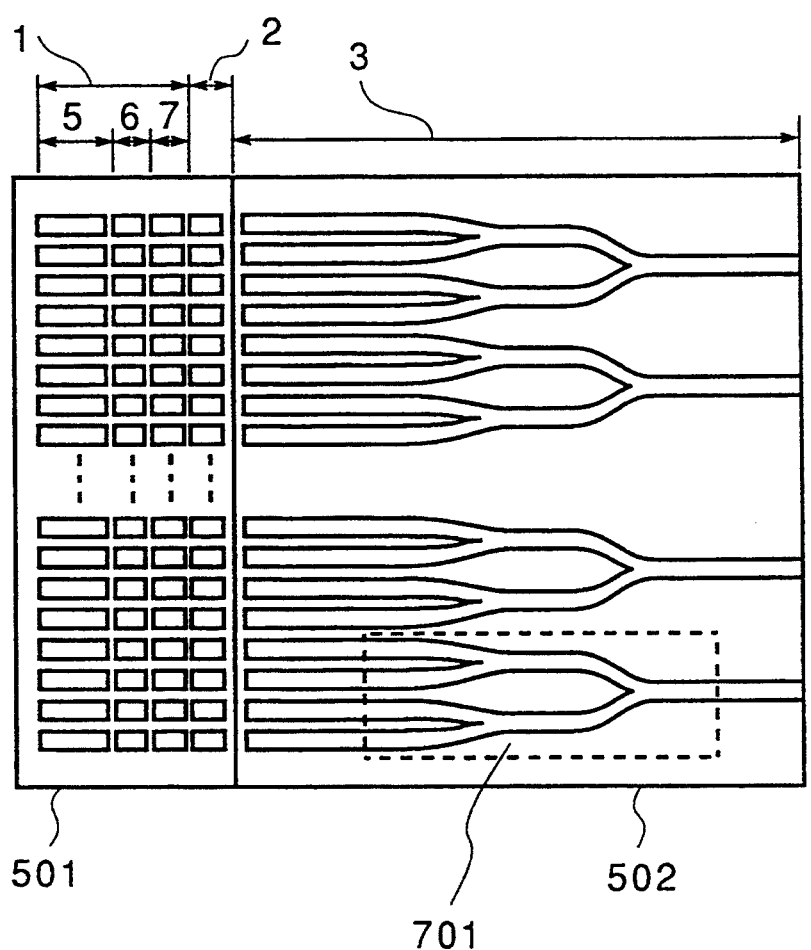
FIG. 7 is a top view of a wafer of another embodiment showing a ridge-type optical waveguide formed by selective growth with respect to an optical coupler unit of the integrated light source for wavelength multiplexing of FIG. 1.
Figure 8:
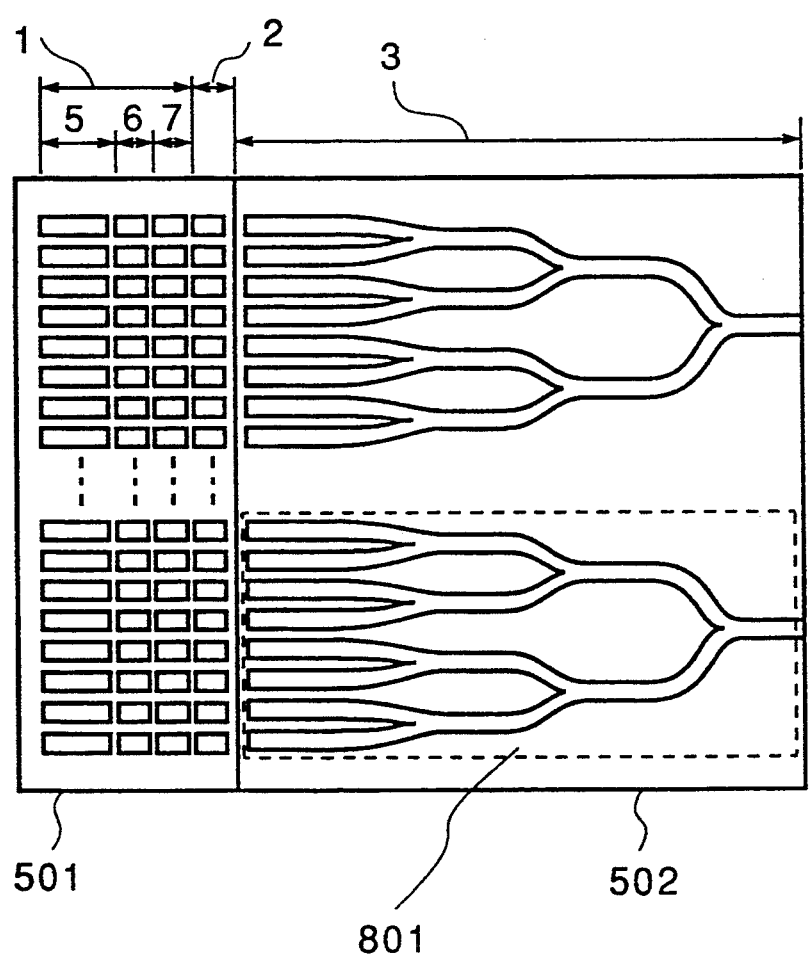
FIG. 8 is a top view of a wafer of yet another embodiment showing a ridge-type optical waveguide formed by selective growth with respect to an optical coupler unit of the integrated light source for wavelength multiplexing of FIG. 1.

In such an integrated light source for wavelength multiplexing, the number of wavelengths to be multiplexed varies depending on customers. For example, one customer might require multiplexing light sources of two wavelengths, another customer might require the multiplexing of light sources of four wavelengths, and yet another customer might require the multiplexing of light sources of eight wavelengths. To meet the requirements of the respective customers, the masks, in response to the number of wavelengths to be multiplexed, have to be prepared from scratch with considerably uneconomical separate processes. As shown in FIGS. 6, 7 and 8, however, multiplexing of a suitable number of wavelengths is achieved by changing only the optical wiring of the Y-branching optical waveguide 601, 701 and 801 of the optical coupler unit 3. This shows that multiplexing of two, four and eight wavelengths may conveniently be produced with an active optical device unit 501 of entirely the same configuration.

Even if customer's requirement for the number of wavelengths to be multiplexed is different, according to the invention, a process of forming the ridge section of the optical coupler may be made into a commonly available form. The processes of FIGS. 2(a) to (e) and FIGS. 3(a) and (b) are independent of the number of multiplexed wavelengths the customer requires, and those processes may be made into commonly available form. According to the invention, only the process of forming an optical waveguide pattern of the optical coupler need be changed by later selective growth to meet the customer's requirement. In such a configuration, most masks may commonly be available. On account of the common processes, the commonly produced wafers may always be stored to provide the respective optical wiring pattern of the optical coupler in accordance with the customer's orders. Thus, according to the invention, the customer's orders may conveniently and quickly be satisfied.

In a second embodiment of FIGS. 9 to 12, a ridge-type optical waveguide of the optical coupler unit 3 is formed of the p-InP cladding layer 107 and p+-InGaAs capping layer 108 like the variable wavelength DBR laser section 1 and the light modulator unit 2 as compared with the first embodiment of FIG. 1.

More specifically, in the first embodiment of FIG. 1, the ridge-type optical waveguide of the optical coupler unit 3 is formed of the i-InP cladding layer 111 with negligible free carrier absorption to be received by the light oozed on the cladding layer and with less loss of the light in an optical waveguide of the optical coupler 3.

Since the variable wavelength DBR laser section 1, the ridge-type optical waveguide of the light modulator 2 and the optical coupler 3 are formed separately, a dimensional registration thereto with the ridge-type optical waveguide of the light modulator 2 is required to form the ridge-type optical waveguide of the optical coupler 3. Such registration accuracy entails variation of coupling loss between the optical modulator 2 and the coupler 3.

Figure 9:
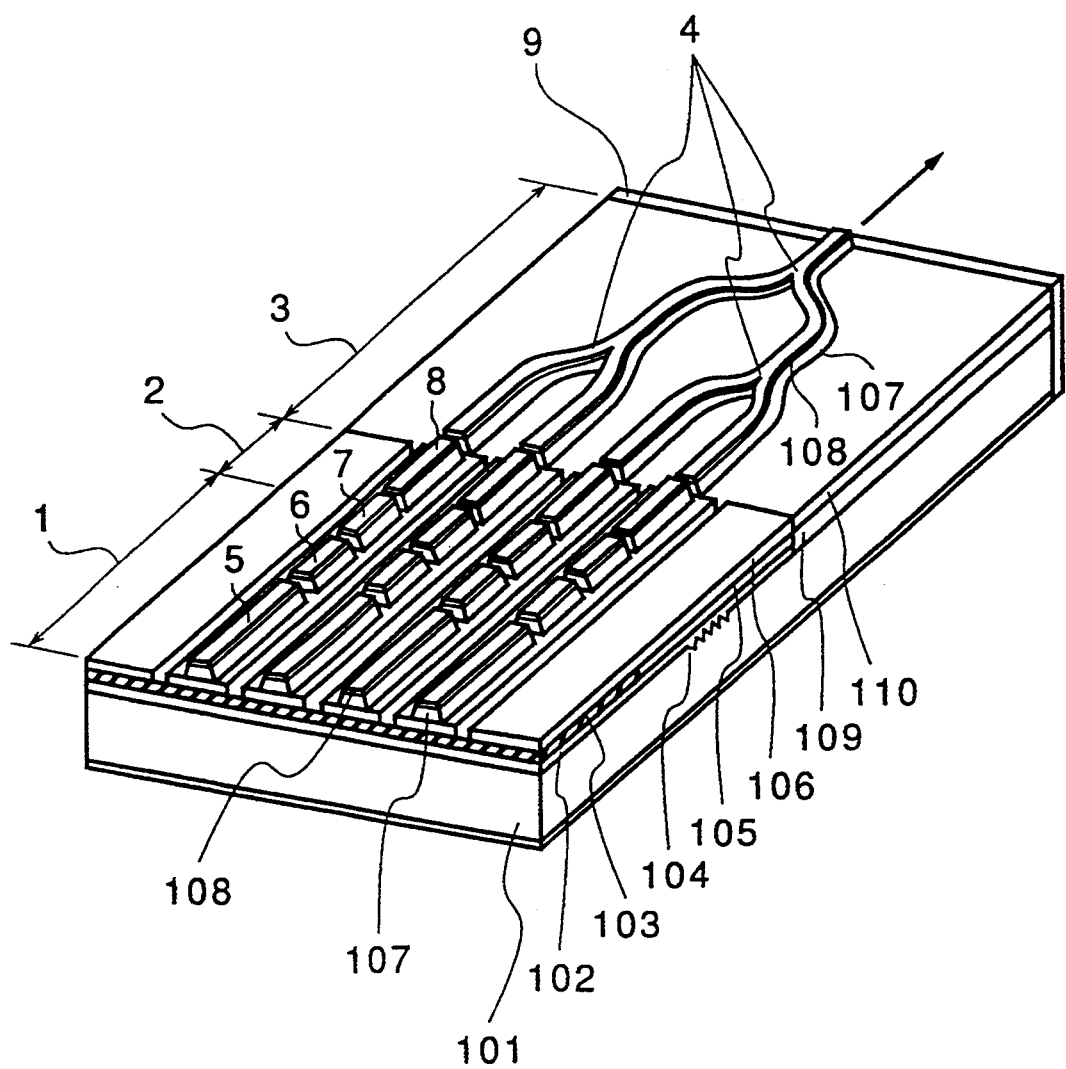
FIG. 9 is a perspective view of a second embodiment of a method of producing an optical integrated circuit according to the present invention, showing a configuration of an integrated light source for wavelength multiplexing.
Figure 10A:
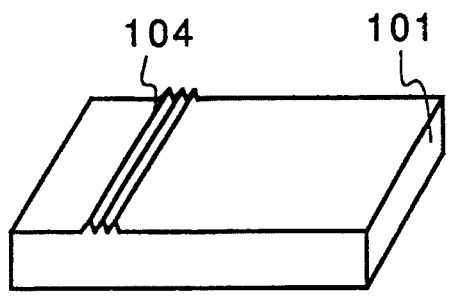
FIGS. 10a–10d are views of successive steps in a method of producing the integrated light source for wavelength multiplexing of FIG. 9.
Figure 10B:
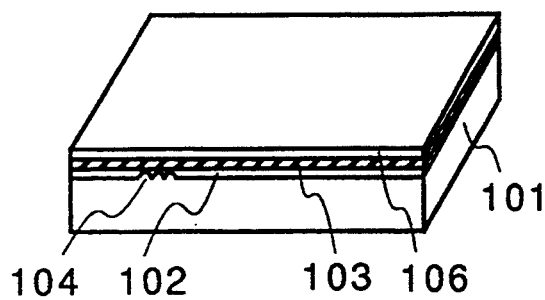
Figure 10C:
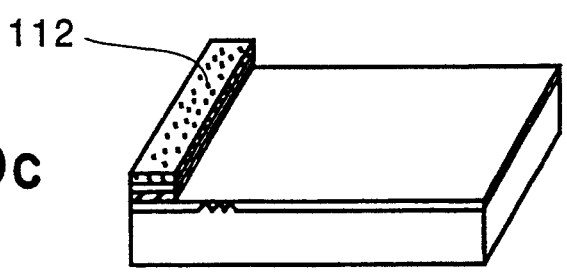
Figure 10D:
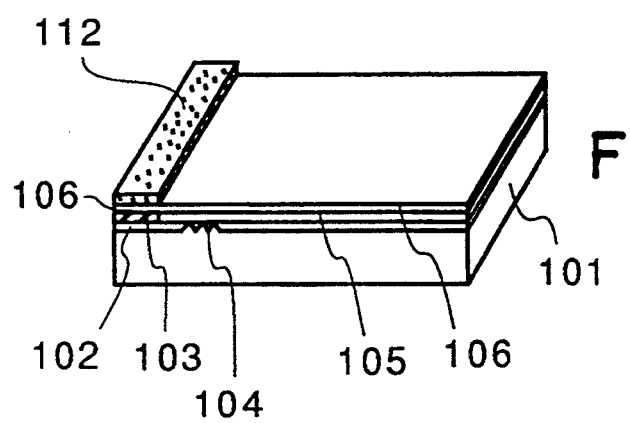

In FIG. 9, since the variable wavelength DBR laser section 1, the ridge-type optical waveguide of the light modulator 2 and the optical coupler 3 are formed together by selective growth at the same time, the optical modulator 2 and the optical coupler 3 are always coupled with less loss of light.

Figure 11A:
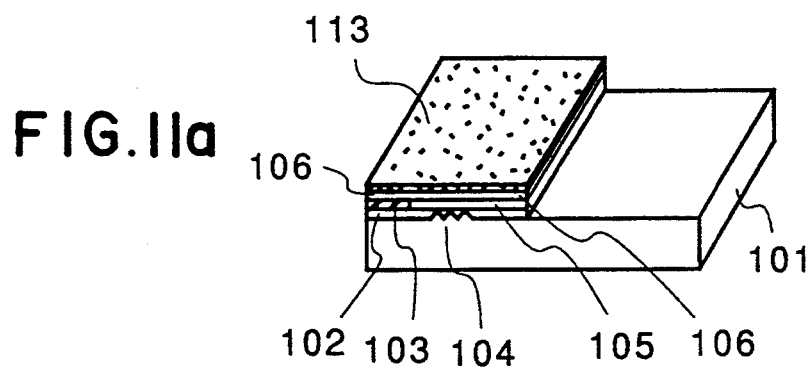
FIGS. 11a–11d are views similar and subsequent to those of FIGS. 10a–10d.
Figure 11B:
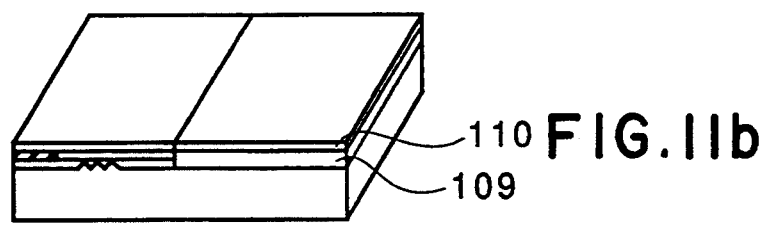
Figure 11C:
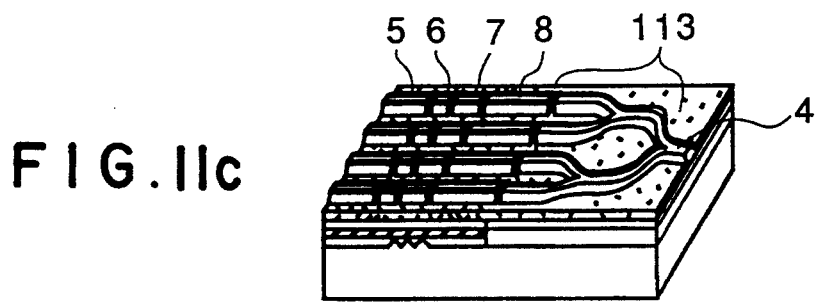
Figure 11D:
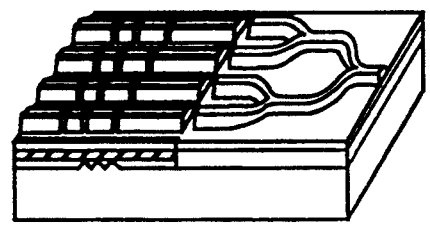

The processes of FIGS. 10a to 10d and of FIGS. 11a and 11b are substantially the same as those of the first embodiment, so that the description thereof is omitted. In FIGS. 11c and 11d, the embodiment is characterized by forming an active optical device and a passive optical device at the same time without any dimension registration between respective optical waveguides. Optical integrated circuits according to this embodiment may be far more conveniently produced as compared with the conventional method.

Figure 12:
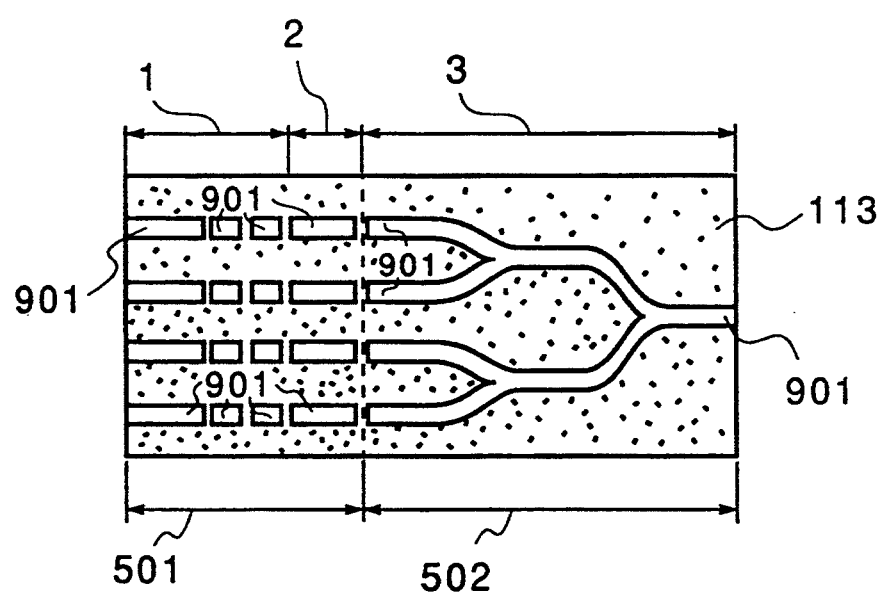
FIG. 12 is a top view of a wafer of an embodiment showing a ridge-type optical waveguide formed by the selective growth with respect to an optical coupler unit of the integrated light source for wavelength multiplexing of FIG. 9.

In FIG. 12, the wafer of FIG. 11b is arranged thereon with a mask formed of SiO₂ film 113 to be used for the selective growth procedure of the ridge section. A ridge section of an active optical device 501 and another ridge section of a passive optical device 502 are of the same configuration so that they may be formed at the same time. Accordingly, a mask to be used for selectively growing the active optical device 501 and another mask to be used for selectively growing the passive optical device 502 may be produced together by the mask forming procedure with the SiO₂ film at the same time thereby to provide the windows 901. Then, the opposite ridge sections described are formed by selective growth, and thus a dimensional registration between the respective optical waveguides is not required in this embodiment.

The custom IC optical integrated circuit with different connection but the same configuration may also be effectively produced by this embodiment. According to the embodiment, since a positional relationship between the respective active optical devices may be determined optionally when ridge-type optical waveguides are ultimately formed together, the embodiment is more suitable for producing the custom IC optical integrated circuit.

It is to be understood that the present invention is not limited to the preferred embodiments as hereinbefore fully described.

For example, configurations of the optical integrated circuits are not limited to the integrated light sources for wavelength multiplexing as specified in the preferred embodiments but may be of any configurations of the optical integrated circuits such as a waveguide-type matrix optical switch, a waveguide-type matrix optical switch integrated thereon with semiconductor laser, a light amplifier and a photo-detector, a coherent receiver integrated thereon with a semiconductor laser of a local oscillator, a waveguide-type 3dB coupler and a photo-detector, a node element to be used for the local area network which is integrated with a waveguide-type optical switch, a semiconductor laser of light sources and a photo-detector of a photo-receiver and the like.

An InP system has been proposed in the embodiments, notwithstanding it is not limited to the InP system as a material system but a GaAs system may preferably be employed. For a crystal growth method, the MOVPE method essentially been described in the preferred embodiment, nevertheless the crystal growth method is not limited to the MOVPE method, but any of the growth method capable of employing the present invention may selectively be available.

As hereinbefore fully described, according to the method of producing the optical integrated circuit of the invention, the substrate is integrated thereon with a plurality of different waveguide-type optical devices with a convenient connection therebetween and less loss of the light. Further, in the method of producing according to the invention, the custom IC optical integrated circuit with different connection but similar configuration may effectively be produced, bringing considerable effects in the fields of optical connection, photonic switching, optical information processing and the like.

What is claimed is:

1. Method for producing a custom optical integrated circuit for wavelength multiplexing a predetermined number of different light sources comprising the steps of:
    forming an array of ridge-type active optical devices on a semiconductor substrate,
    burying a portion of said semiconductor substrate not occupied by said ridge-type active optical devices with semiconductor layers comprising an optical guiding layer and a cladding layer,
    forming a dielectric mask pattern to be used for selective growth on said semiconductor layers,
    forming simultaneously, by selective growth only at windows of said dielectric mask, a plurality of Y-branching optical waveguides connected to said array of active optical devices, in such a pattern as to wavelength multiplex said predetermined number of different light sources.

2. The method according to claim 1, wherein said step of forming Y-branching optical waveguides comprises forming, simultaneously with said waveguides, additional Y-branching optical waveguides at output ends of said Y-branching optical waveguides.

3. A method of producing an optical integrated circuit comprising the steps of:
    forming ridge-type active optical device areas on a semiconductor substrate without forming ridge sections of ridge-type active optical devices,
    burying a portion of said semiconductor substrate not occupied by said ridge-type active optical device areas with semiconductor layers comprising an optical guiding layer and a cladding layer,
    forming a dielectric mask pattern on said ridge-type active optical device areas and said semiconductor layers, and
    simultaneously forming (a) ridge sections of said ridge-type active optical devices and (b) a ridge section of a ridge-type passive optical waveguide connected to said ridge-type active optical devices, by selective growth of a semiconductor cladding layer only on a window of said dielectric mask pattern.

* * * * *